US009240763B2

(12) United States Patent
Baumgarte (10) Patent No.: US 9,240,763 B2
(45) Date of Patent: Jan. 19, 2016

(54) LOUDNESS NORMALIZATION BASED ON USER FEEDBACK

(71) Applicant: Apple Inc., Cupertino, CA (US)

(72) Inventor: Frank M. Baumgarte, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 246 days.

(21) Appl. No.: 14/089,570

(22) Filed: Nov. 25, 2013

(65) Prior Publication Data

US 2015/0146886 A1    May 28, 2015

(51) Int. Cl.
*H03G 3/00*    (2006.01)
*H03G 3/02*    (2006.01)
*H03G 3/30*    (2006.01)

(52) U.S. Cl.
CPC ............... *H03G 3/02* (2013.01); *H03G 3/3005* (2013.01); *H03G 3/3089* (2013.01)

(58) Field of Classification Search
CPC ...... H03G 3/3005; H03G 3/3089; H03G 3/02
USPC .......................................................... 381/107
See application file for complete search history.

(56) References Cited

U.S. PATENT DOCUMENTS

| 2010/0250258 | A1 | 9/2010 | Smithers et al. | |
| 2010/0310085 | A1 | 12/2010 | Oh et al. | |
| 2013/0156229 | A1 | 6/2013 | Riedl | |
| 2014/0328500 | A1* | 11/2014 | Patwardhan et al. | H03G 5/16 381/107 |

FOREIGN PATENT DOCUMENTS

WO    WO 2013/068637 A1    5/2013

OTHER PUBLICATIONS

Fraunhofer IIS. "White Paper HE-AAC Metadata for Digital Broadcasting." (Sep. 2011). 16 pages.
Advanced Television Systems Committee, Inc. "A/53:ATSC Digital Television Standard, Parts 1-6." Washington, D.C. (Jan. 2007). 136 pages.
Advanced Television Systems Committee, Inc. "ATSC Recommended Practice: Techniques for Establishing and Maintaining Audio Loudness for Digital Television." Washington, D.C. (Jul. 2011). 76 pages.

(Continued)

*Primary Examiner* — Paul S Kim
(74) *Attorney, Agent, or Firm* — Blakely, Sokoloff, Taylor & Zafman LLP (57) ABSTRACT

A system for performing loudness normalization based on user feedback is described herein. The system includes a content delivery system and a plurality of audio playback devices. The audio playback devices may communicate volume settings used during playback of pieces of sound program content to the content delivery system. Based on these collected data points, a statistical analysis may be performed to generate loudness adjustment values for pieces of sound program content. The loudness adjustment values may be communicated to the audio playback devices through metadata in associated pieces of sound program content or as separate communications from the content delivery system. An offline version is also described that supports individual loudness normalization adjustments based on a single user's preferences. Under either system, loudness normalization may be achieved based on real world volume settings for individual pieces of sound program content played using various playback configurations.

13 Claims, 5 Drawing Sheets

(56) References Cited

OTHER PUBLICATIONS

Advanced Television Systems Committee, Inc. "ATSC Standard: Digital Audio Compression (AC-3, E-AC-3)." Washington, D.C. (Dec. 2012). 270 pages.

Dolby Laboratories, Inc. "Dolby® Metadata Guide." Issue 3, S05/14660/16797 (2005). 28 pages.

EBU-UER. "Loudness Normalisation and Permitted Maximum Level of Audio Signals." EBU Recommendation R 128. Geneva, Switzerland (Aug. 2011). 5 pages.

ETSI, EBU. "Digital Video Broadcasting (DVB); Specification for the Use of Video and Audio Coding in Broadcasting Applications Based on the MPEG-2 Transport Stream." ETSI TS 101 154 v1.11.1. (2012). 125 pages.

ISO/IEC. "Information Technology—Coding of Audio-Visual Objects—Parts 3: Audio." ISO/IEC 14496-3:200X(E). Fourth Edition, 200X-XX-XX. Switzerland (2009). 150 pages.

International Telecommunications Union (ITU), ITU-R Radiocommunication Sector of ITU. "Algorithms to Measure Audio Programme Loudness and True-Peak Audio Level." Recommendation ITU-R BS.1770-3. Geneva, Switzerland (2012). 24 pages.

ISO/IEC. "Information Technology—Generic Coding of Moving Pictures and Associated Audio Information—Part 7: Advanced Audio Coding (AAC)." ISO/IEC 13818-7:2004(E). Third Edition. Switzerland, (Oct. 15, 2004). 206 pages.

\* cited by examiner

LOUDNESS NORMALIZATION BASED ON USER FEEDBACK

FIELD

A system and method for adjusting the loudness of a piece of sound program content played on an audio playback device based on user feedback generated in response to playing the piece of sound program content on other audio playback devices or on the same audio playback device is described. Other embodiments are also described.

BACKGROUND

The music industry produces audio content at various loudness levels. This lack of an established standard during production provides a poor user experience when randomly playing back content produced by different entities, produced for different albums, and/or content of different genres as loudness levels may wildly fluctuate.

The movie industry widely adopted a loudness normalization scheme based on the loudness of dialog anchors in a movie.[1] Further, the International Telecommunication Union Radiocommunication (ITU-R) Sector ratified loudness normalization recommendations based on program loudness.[2] The result is that all content in movies is at a static target loudness level after normalization. This approach reduces the need for a user to adjust volume settings triggered by inconsistent loudness variations from one audio track to another.

[1] ATSC, "ATSC Standard: Digital Audio Compression (AC-3, E-AC-3)," Doc. A/52:2012 23 Mar. 2012.
[2] ITU-R, "Algorithms to measure audio programme and true-peak audio level," Recommendation ITU-R BS.1770-3, August 2012.

While loudness normalization is a first step in the right direction, it still results in undesired and sometimes unexpected loudness levels. This is because the assumption that all content should play at the same static target loudness is not always correct.

SUMMARY

A system for performing loudness normalization based on user feedback is described herein. The system includes a content delivery system and a plurality of audio playback devices. The content delivery system may be coupled to the plurality of audio playback devices through a network.

Each of the audio playback devices may adjust volume settings while pieces of sound program content are being played on each device. The adjustments may be made by users of each corresponding device such that a preferred loudness is achieved. The audio playback devices may communicate these user adjusted volume settings used during playback of each piece of sound program content to the content delivery system. In some embodiments, the transmission of volume settings to the content delivery system may include data regarding the playback configuration on corresponding audio playback devices. Based on these collected data points, a statistical analysis may be performed to generate loudness adjustment values for pieces of sound program content. The loudness adjustment values may be communicated to audio playback devices through metadata in associated pieces of sound program content or as separate communications from the content delivery system. These loudness adjustment values may thereafter be used to adjust loudness of the pieces of sound program content played on the audio playback devices.

In one embodiment, an offline version of the loudness normalization system is also described that supports individual loudness normalization adjustments based on a single user's preferences. Under either embodiment, loudness normalization may be achieved based on real world volume settings for individual pieces of sound program content played using various playback configurations.

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one.

DETAILED DESCRIPTION

Several embodiments are described with reference to the appended drawings are now explained. While numerous details are set forth, it is understood that some embodiments of the invention may be practiced without these details. In other instances, well-known circuits, structures, and techniques have not been shown in detail so as not to obscure the understanding of this description.

Figure 1:
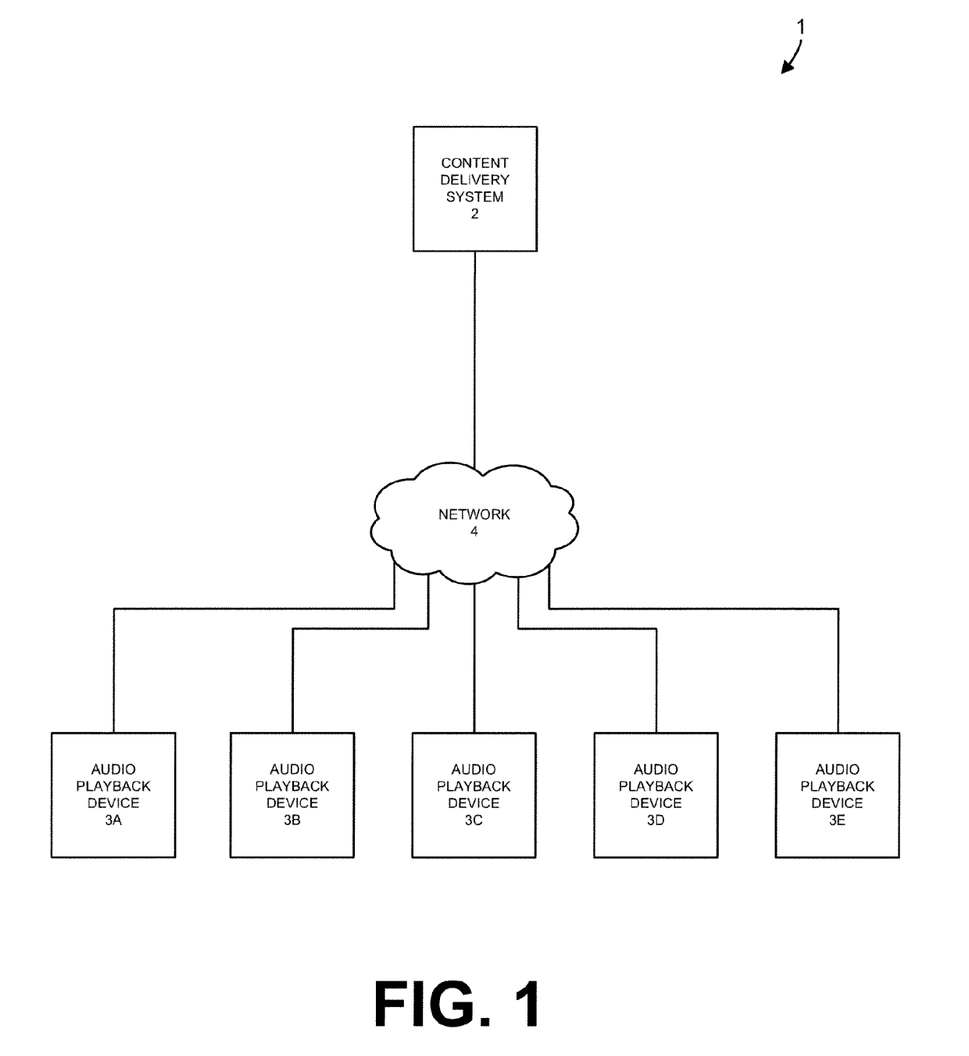
FIG. 1 shows a system for performing loudness normalization based on user feedback according to one embodiment.

FIG. 1 shows a system 1 for performing loudness normalization based on user feedback according to one embodiment. The system 1 includes a content delivery system 2 and a plurality of audio playback devices 3A-3E. The content delivery system 2 may be coupled to the plurality of audio playback devices 3A-3E through the network 4. Each element of the system 1 for performing loudness normalization based on user feedback will be described by way of example below.

Figure 2:
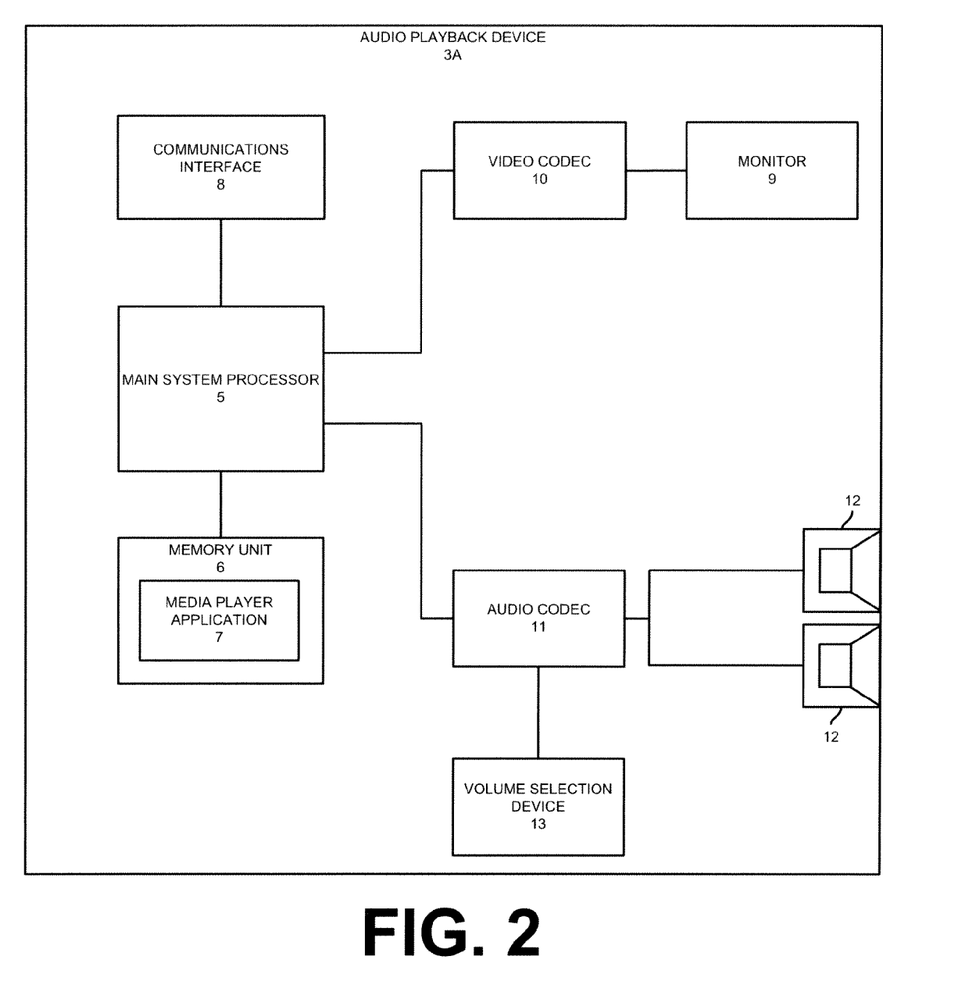
FIG. 2 shows a component diagram for an audio playback device according to one embodiment.

The audio playback devices 3A-3E may be any digital electronic devices that may playback pieces of sound program content (e.g., a digital music file, a digital movie with an audio track, etc.) to a user. For example, the audio playback devices 3A-3E may be one or more of a laptop computer, a desktop computer, a tablet computer, a portable music player, a portable telephony device, or another similar computing device that may play pieces of sound program content. FIG. 2 shows an example component diagram for the audio playback device 3A according to one embodiment. Each of the audio playback devices 3B-3E may include similar components to those shown and described in relation to the audio playback device 3A. Each element of the audio playback device 3A will be described by way of example below.

As shown in FIG. 2, the audio playback device 3A may include a main system processor 5 and a memory unit 6. The processor 5 and memory unit 6 are generically used here to refer to any suitable combination of programmable data processing components and data storage that conduct the operations needed to implement the various functions and operations of the audio playback device 3A. The processor 5 may be a special purpose processor such as an application-specific integrated circuit (ASIC), a general purpose microprocessor, a field-programmable gate array (FPGA), a digital signal controller, or a set of hardware logic structures (e.g., filters, arithmetic logic units, and dedicated state machines) while the memory unit 6 may refer to microelectronic, non-volatile random access memory. An operating system may be stored in the memory unit 6, along with application programs specific to the various functions of the audio playback device 3A, which are to be run or executed by the processor 5 to perform the various functions of the audio playback device 3A. For example, the memory unit 6 may include a media player application 7, which in conjunction with other hardware elements of the audio playback device 3A plays pieces of sound program content to a user.

In one embodiment, the audio playback device 3A may include a communications interface 8 for communicating with the content delivery system 2 and/or other components over one or more wired or wireless connections as will be described in further detail below. For example, the communications interface 8 may be capable of communicating using Bluetooth, the IEEE 802.11x suite of standards, IEEE 802.3, cellular Global System for Mobile Communications (GSM), cellular Code Division Multiple Access (CDMA), and/or Long Term Evolution (LTE). In one embodiment, the communications interface 8 facilitates the reception of sound program content, including loudness normalization metadata, from the content delivery system 2, and transmission of volume settings and other data related to the playback of a piece of sound program content to the content delivery system 2.

In one embodiment, the audio playback device 3A may include a monitor 9 for displaying video associated with sound program content and/or a user interface for adjusting volume settings or loudness normalization settings. The monitor 9 may utilize any display technology, including a liquid crystal display (LCD) panel, a plasma display panel, and/or an organic light emitting diode (OLED) display panel.

In one embodiment, the audio playback device 3A may include a video codec 10 for processing video signals. For example, the video codec 10 may process video signals such that these video signals may be displayed on the monitor 9. The processing may include antialiasing, up-conversion, down-conversion, de-noising, and/or digital cropping/zooming.

In one embodiment, the audio playback device 3A may include an audio codec 11 for managing digital and analog audio signals. For example, the audio codec 11 may manage one or more speakers 12 coupled to the audio codec 11. Management of audio signals may include digital-to-analog conversion, loudness normalization, and general signal processing.

The one or more speakers 12 may be used for producing sound based on pieces of sound program content played by the media player application 7. The one or more speakers 12 may be integrated within a single casing along with other components of the audio playback device 3A. In other embodiments, the one or more speakers 12 may be separate from the other components of the audio playback device 3A. For example, the one or more speakers 12 may be wireless headphones and connected to the other components of the audio playback device 3A through a wireless connection (e.g., a Bluetooth connection with the communications interface 8). In another example, the one or more speakers 12 may be connected to the other components of the audio playback device 3A through a wired connection with a physical input port coupled to the audio codec 11.

The speakers 12 may be any combination of full-range drivers, mid-range drivers, subwoofers, woofers, and tweeters. Each of the speakers 12 may use a lightweight diaphragm, or cone, connected to a rigid basket, or frame, via a flexible suspension that constrains a coil of wire (e.g., a voice coil) to move axially through a cylindrical magnetic gap. When an electrical audio signal is applied to the voice coil, a magnetic field is created by the electric current in the voice coil, making it a variable electromagnet. The coil and the speakers 12's magnetic system interact, generating a mechanical force that causes the coil (and thus, the attached cone) to move back and forth, thereby reproducing sound under the control of the applied electrical audio signal coming from a source (e.g., the audio codec 11). Each speaker 12 may be individually and separately driven to produce sound in response to separate and discrete audio signals. Although shown as including two speakers 12, the audio playback device 3A may include any number of speakers 12.

In one embodiment, the audio playback device 3A may include a volume selection device 13. The volume selection device 13 allows a user to adjust the volume of sound emitted by the one or more speakers 12. In one embodiment, the volume selection device 13 may be a physical interface mechanism (e.g., a toggle switch, a rotary switch, a set of physical buttons, etc.) and/or a virtual interface mechanism (e.g., a slider bar presented in a user interface on the monitor 9). The volume selection device 13 may adjust a volume setting that is used by the audio playback device 3A (e.g., used by an amplifier within the audio playback device 3A) to drive the one or more speakers 12. The volume setting may allow a range of values (e.g., 0-10, 0-100, etc.) such that the volume selection device 13 allows the user to set the volume setting to a value within the predefined range. For example, the user may initially set the volume setting to a value of eight using the volume selection device 13. Thereafter, the user may adjust the volume setting to a higher value (e.g., a value of ten) or a lower value (e.g., a value of three). This adjustment may be made by the user to reflect a preference by the user for louder or quieter sound produced by the audio playback device 3A.

In some embodiments, the audio playback device 3A may include more components than those shown in FIG. 2 and described above. As noted above, the audio playback devices 3B-3E may be similarly configured as described above in relation to the audio playback device 3A.

Figure 3:
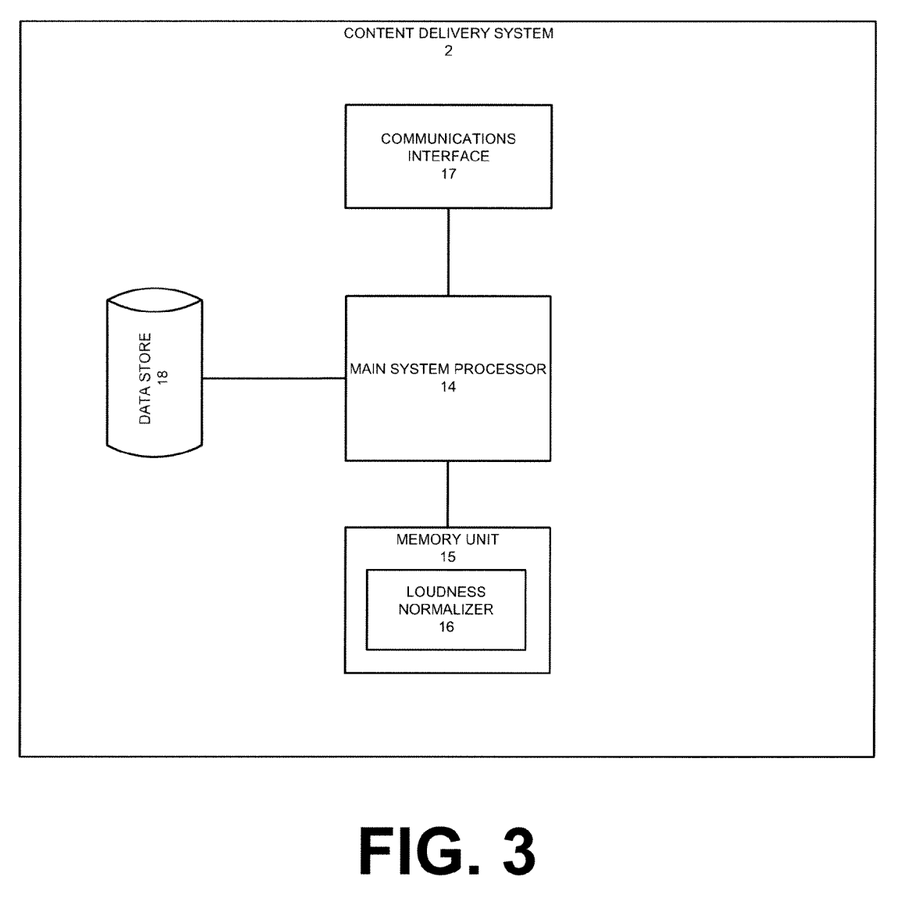
FIG. 3 shows a component diagram of a content delivery system according to one embodiment.

FIG. 3 shows a component diagram of the content delivery system 2 according to one embodiment. The content delivery system 2 is a system that delivers sound program content (e.g., music and/or movies) and/or loudness adjustment values for use with loudness normalization to one or more of the audio playback devices 3A-3E. The content delivery system 2 may provide streaming services and/or download services to each of the audio playback devices 3A-3E such that sound program content stored on the content delivery system 2 is accessible by the audio playback devices 3A-3E for playback. Each element of the content delivery system 2 will now be described by way of example.

As shown in FIG. 3, the content delivery system 2 may include a main system processor 14 and a memory unit 15. The processor 14 and memory unit 15 are generically used here to refer to any suitable combination of programmable data processing components and data storage that conduct the operations needed to implement the various functions and operations of the content delivery system 2. The processor 14 may be a special purpose processor such as an application-specific integrated circuit (ASIC), a general purpose microprocessor, a field-programmable gate array (FPGA), a digital signal controller, or a set of hardware logic structures (e.g., filters, arithmetic logic units, and dedicated state machines) while the memory unit 15 may refer to microelectronic, non-volatile random access memory. An operating system may be stored in the memory unit 15, along with application programs specific to the various functions of the content delivery system 2, which are to be run or executed by the processor 14 to perform the various functions of the content delivery system 2. For example, the memory unit 15 may include a loudness normalizer 16, which determines loudness adjustment levels for pieces of sound program content based on user feedback as will be described in further detail below.

In one embodiment, the content delivery system 2 may include a communications interface 17 for communicating with the audio playback devices 3A-3E and/or other components over the network 4 as will be described in further detail below. For example, the communications interface 17 may be capable of communicating using Bluetooth, the IEEE 802.11x suite of standards, IEEE 802.3, cellular Global System for Mobile Communications (GSM), cellular Code Division Multiple Access (CDMA), and/or Long Term Evolution (LTE). In one embodiment, the communications interface 17 facilitates the transmission of one or more pieces of sound program content, including loudness adjustment level metadata, to the audio playback devices 3A-3E. The one or more pieces of sound program content may be stored locally within the content delivery system 2 or on a remote server. For example, the one or more pieces of sound program content may be stored in the data store 18. The data store 18 may be any type of data storage device capable of storing digital media, including metadata.

Although shown and described as a single computing device, in other embodiments the content delivery system 2 may be a set of devices that collectively carry out the operations described herein. For example, the content delivery system 2 may be implemented by a distributed set of computing devices that communicate over a local and/or wide area network (e.g., the network 4).

Figure 4:
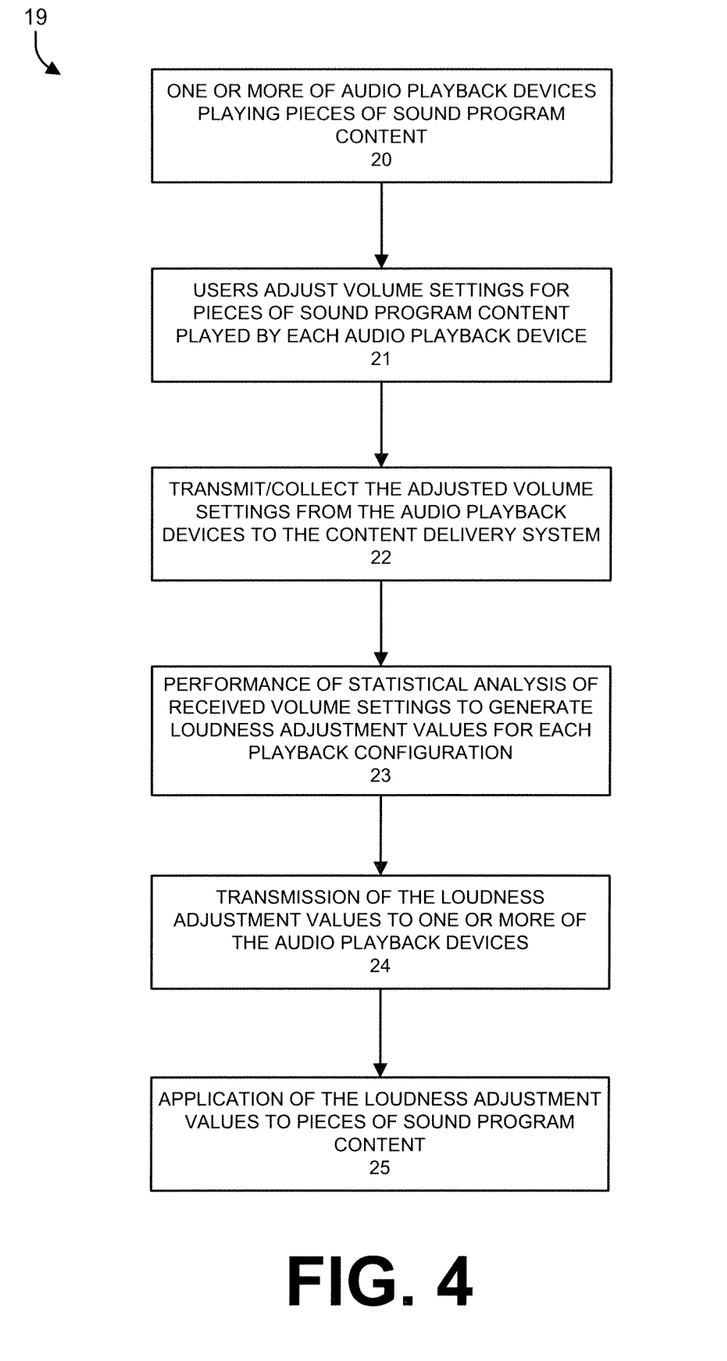
FIG. 4 shows a method for adjusting the loudness of a piece of sound program content played on an audio playback device based on user feedback according to one embodiment.

Turning now to FIG. 4, a method 19 for adjusting the loudness of a piece of sound program content played on an audio playback device 3A-3E based on user feedback will be described. Each operation of the method 19 may be performed by one or more components of one or more of the audio playback devices 3A-3E and/or the content delivery system 2. Each operation of the method 19 will be described by way of example below.

Figure 5:
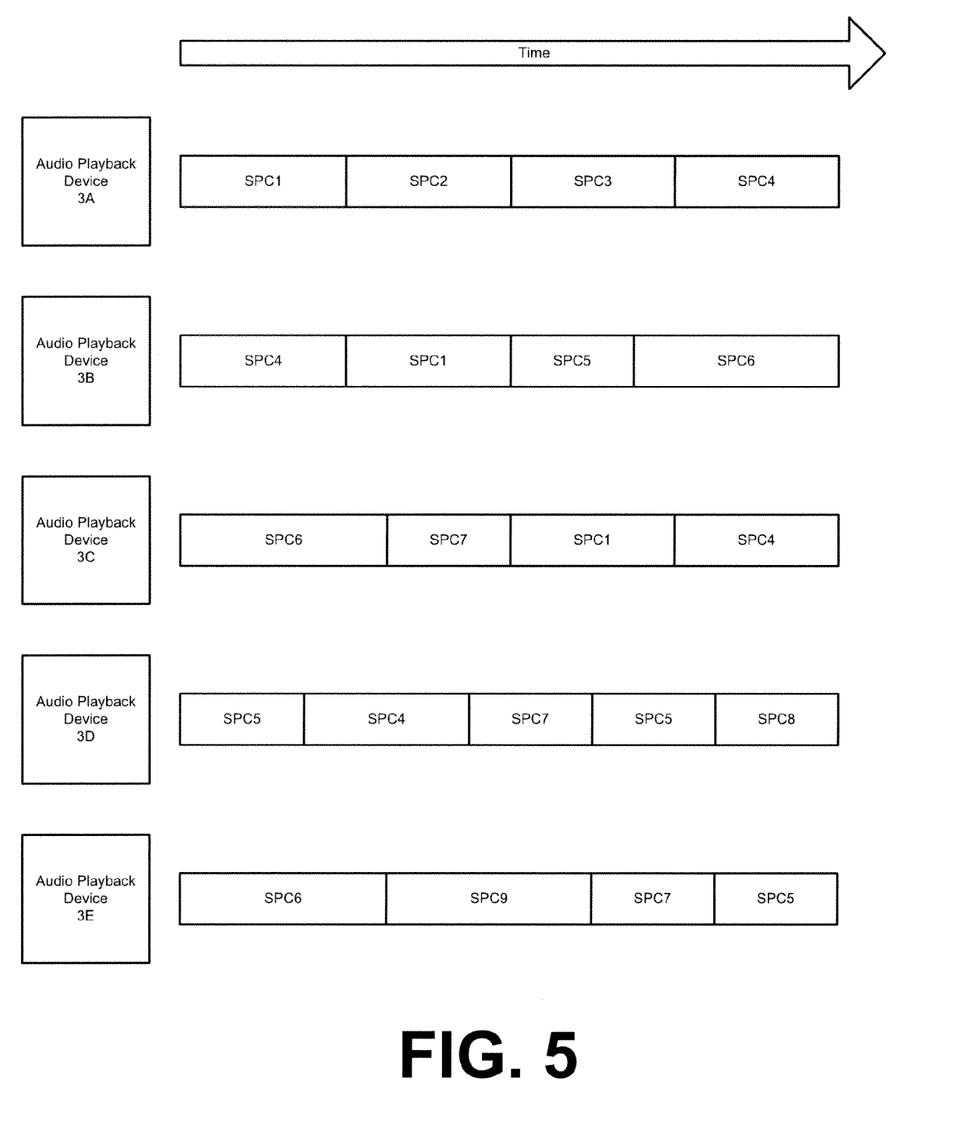
FIG. 5 shows pieces of sound program content played over time on various audio playback devices according to one embodiment.

The method 19 may commence at operation 20 with one or more of the audio playback devices 3A-3E playing pieces of sound program content. For example, the playback devices 3A-3E may play songs or movies (with audio tracks) using the media player application 7 running on each device 3A-3E. Each of the audio playback devices 3A-3E may perform operation 20 concurrently or at different points in time. The audio playback devices 3A-3E may playback the same pieces of sound program content at the same time or at different times. For example, FIG. 5 shows the pieces of sound program content SPC1-SPC9 played over time on the audio playback devices 3A-3E. As shown, at operation 20 the audio playback device 3A sequentially plays SPC1, SPC2, SPC3, and SPC4; the audio playback device 3B sequentially plays SPC4, SPC1, SPC5, and SPC6; the audio playback device 3C sequentially plays SPC6, SPC7, SPC1, and SPC4; the audio playback device 3D sequentially plays SPC5, SPC4, SPC7, SPC5, and SPC8; and the audio playback device 3E sequentially plays SPC6, SPC9, SPC7, and SPC5. As shown in this example, each of the audio playback devices 3A-3E may playback the same or different pieces of sound program content at different points in time. Each of these pieces of sound program content may have been originally received from the content delivery system 2 or from another source through either a streaming or download service. Although described as each of the audio playback devices 3A-3E performing operation 20, in other embodiments more or less audio playback devices 3A-3E may perform operation 20.

After operation 20 has started playing the pieces of sound program content, at operation 21 a corresponding user for each of the audio playback devices 3A-3E performing operation 20 adjusts a volume setting while a corresponding piece of sound program content is playing. Adjustment of the volume setting may be performed using the volume selection device 13 incorporated into each of the audio playback devices 3A-3E. For example, the user may use a set of physical buttons that represent the volume selection device 13 to perform operation 21 or the user may adjust a virtual user interface element within the media player application 7 that represents the volume selection device 13. The user may adjust the volume at operation 21 such that associated sound produced for each piece of sound program content being played by the audio playback devices 3A-3E meets the personal preferences of each user.

At operation 22, the volume settings set by each user at operation 21 may be transmitted over the network 4 to the content delivery system 2. In one embodiment, in addition to the transmission of the volume settings, operation 22 may also transmit additional information related to the pieces of sound program content played on each of the audio playback devices 3A-3E and the manner in which the pieces of sound program content are being played. For example, the additional information may include 1) an identifier for the piece of sound program content (e.g., a numerical identifier and/or a title), 2) content loudness metadata (e.g., Program Loudness[3] or Dialnorm[4]), 3) loudness adjustment values, 4) status of loudness normalization (e.g., on or off), 5) a device identifier (e.g., serial number or model number for an audio playback device 3A-3E), 6) a playback route identifier (e.g., internal loudspeakers, headphones, or line out), 7) a playback mode identifier (e.g., shuffle, playlist, or album), and/or an 8) an application identifier for the application playing the designated piece of sound program content (e.g., application name of the media player application 7). In one embodiment, when a network connection for an audio playback device 3A-3E is non-functional or the content delivery system 2 is otherwise unavailable, this data may be stored or queued on the audio playback devices 3A-3E prior to transmission to the content delivery system 2. For example, the data related to the played pieces of sound program content and the manner in which the pieces of sound program content are being played may be queued in the memory unit 6 before transmission to the content delivery system 2.

[3] ITU-R, "Algorithms to measure audio programme and true-peak audio level," Recommendation ITU-R BS.1770-3, August 2012.
[4] ATSC, "ATSC Standard: Digital Audio Compression (AC-3, E-AC-3)," Doc. A/52:2012 23 Mar. 2012.

Following transmission of data at operation 22, operation 23 may perform an independent statistical analysis for each specific playback configuration used for each played piece of sound program content. For example, a configuration may be defined by the audio playback device type, the playback route, and the playback mode used for a piece of sound program content. In other embodiments, alternate parameters may be used to define a configuration. Based on this statistical analysis, loudness adjustment values may be generated for each configuration.

Below is an example statistical analysis that may be performed at operation 23 to generate loudness adjustment values for each configuration. In the statistical analysis shown below, the following variables may be used:

| | |
|---|---|
| K | Number of different pieces of sound program content |
| N | Number of instances of sound program content k |
| $\overline{L}_{tot}$ | Average loudness across all pieces of sound program content with a specific configuration in dBFS |
| $\overline{L}_{spc}$ | Average loudness across all pieces of sound program content with a specific configuration in dBFS |
| $\overline{L}_{spc}(k)$ | Average loudness of sound program content k in dBFS |
| $L_{target}$ | Target Loudness after traditional normalization in dBFS |
| $L_{ref}(k)$ | Loudness of sound program content k before normalization (program loudness or dialNorm) in dBFS |
| $L_{vol}(k, n)$ | Volume setting for sound program content k and instance n in dBFS |
| $L_{adj,user}(k, n)$ | Loudness adjustment value for song k and instance n on an audio playback device in dB |
| $L_{adj,server}(k)$ | Loudness adjustment value for song k on the content delivery system 2 in dB |
| $w_{tune}$ | Constant parameter to take into account that only some users will adjust the volume if the loudness is inconsistent (value may be found experimentally but expected to be larger than 1) |
| $g_{norm}$ | Linear loudness normalization gain including adjustment applied before the user volume control |

In this embodiment, data from audio playback devices 3A-3E will be discarded where loudness normalization has been turned "off" on an audio playback device 3A-3E. Based on the remaining data values, an average playback volume is computed for each configuration as shown in the example equation below:

$$\overline{L}_{tot} = L_{target} + \frac{1}{NK} \sum_{n=1}^{N} \sum_{k=1}^{K} [L_{vol}(k, n) + L_{adj,user}(k, n)]$$

Subsequently, an average playback volume is computed for each individual piece of sound program content as shown in the example equation below:

$$\overline{L}_{SPC}(k) = L_{target} + \frac{1}{N} \sum_{n=1}^{N} [L_{vol}(k, n) + L_{adj,user}(k, n)]$$

Thereafter, a loudness adjustment value may be derived from the difference between the overall average and the song average volume with a tuning factor $w_{tune}$ as shown in the example equation below:

$$\overline{L}_{adj,server}(k) = w_{tune}[\overline{L}_{SPC}(k) - \overline{L}_{tot}]$$

The above loudness adjustment value, which may be computed for each specific playback configuration used for each played piece of sound program content, may be transmitted to one or more audio playback devices 3A-3E as will be described in further detail below. Although described in relation to the above equations, in other embodiments alternate statistical analysis techniques, which take into account user feedback, may be similarly used.

Refinements of the statistical analysis described above may include analysis of the volume changes within a session. A session is an uninterrupted audio playback from start to end on an audio playback device 3A-3E. Statistical analysis based on sessions may assist in eliminating the influence of volume changes made outside of the application that contains the volume setting profiling, such as the media player application 7. Accordingly, volume changes within a session could be mostly triggered by inconsistent loudness.

Yet another example of generating adjustment values is based on only those data records that contain user volume changes in playback sessions with loudness normalization turned on where a randomized playback mode was used. This requirement is used to increase the likelihood that volume changes are triggered by undesired playback loudness variations. For each session, the overall average loudness may be calculated. Thereafter, for each song the difference between the loudness of the song and the overall loudness of the session is calculated. The loudness adjustment value may be obtained by computing the mean value of the loudness difference for all sessions that fulfill the requirements. In other embodiments, similar variations to the above statistical approaches may be performed to generate loudness adjustment values.

As noted above, the loudness adjustment values computed at operation 23 may be transmitted to one or more of the audio playback devices 3A-3E at operation 24. In one embodiment, this transmission may be made along with the corresponding piece of sound program content. For example, a user of the audio playback device 3E may request the piece of sound program content SPC1 for download or streaming. Based on previous playbacks of the piece of sound program content SPC1 using various configurations (e.g., the piece of sound program content SPC1 was played by the audio playback devices 3A-3C), the method 19 may have calculated a loudness adjustment value for the piece of sound program content SPC1 based on volume changes during these previous playbacks. In this example, the loudness adjustment value calculated for the piece of sound program content SPC1 may be added to metadata of the piece of sound program content SPC1 prior to transmission to the audio playback device 3E.

In other embodiments, loudness adjustment values may be transmitted separate from associated pieces of sound program content sent to the audio playback devices 3A-3E. For example, in one embodiment, the audio playback device 3E may initiate playing of the piece of sound program content SPC1. The piece of sound program content SPC1 may have been retrieved from the content delivery system 2 or a source other than the content delivery system 2. Regardless of the original source of the piece of sound program content SPC1, the audio playback device 3E may generate loudness normalization metadata locally with access to the content delivery system 2. For example, ITU loudness may be first generated on the device 3E according to ITU-R, "Algorithms to measure audio programme and true-peak audio level," Recommendation ITU-R BS.1770-3, August 2012. Thereafter, the piece of sound program content SPC1 may be identified and matched with content on the content delivery system 2. With that information, loudness adjustment values may be obtained from the content delivery system 2 and inserted in the piece of sound program content SPC1. In instances in which the piece of sound program content SPC1 cannot be located on the content delivery system 2, the loudness adjustment value may be set to 0 dB and normalization on the audio playback device may revert back to the standard ITU approach.

Following receipt of the loudness adjustment values, operation 25 may apply the loudness adjustment values to pieces of sound program content. Using the example statistical approach described above, the audio playback devices 3A-3E may apply a gain $g_{norm}$ using the equation below before the user volume control takes place:

$$g_{norm}=10^{0.05[L_{target}-L_{ref}(k)+L_{adj,user}(k)]}$$

In this example embodiment, the user volume control gain may be represented as:

$$g_{vol}=10^{0.05L_{vol}}$$

The audio output $x_{out}$ signal is a scaled version of the reference signal $x_{ref}$ as shown in the below example equation:

$$x_{out}=g_{norm}g_{vol}x_{ref}$$

As described above, using statistical analysis of crowd-sourced volume settings for particular playback configurations while playing pieces of sound program content, the method 19 may provide an enhanced loudness normalization scheme that utilizes actual user loudness preferences. Audio playback devices 3 that do not have access to the content delivery system 2 and/or do not have general network access (e.g., audio playback devices 3 that lack the necessary hardware components or environmental infrastructure) may not be able to take advantage of the updated and improved loudness adjustment values provided by the content delivery system 2. For these audio playback devices 3 and in situations where a user prefers to adapt the loudness normalization only to their own taste/preferences as opposed to a whole user population, an offline version of the method 19 may be used.

Just as with the method 19 and system 1 described above, the user volume settings in a non-crowd source volume normalization technique are recorded on the audio playback device 3 with accompanying metadata. Over time, a sufficiently large database may build up that allows statistical analysis to be performed in similar ways as described above. Based on this analysis, the audio playback device 3 may update the volume adjustment values for the pieces of sound program content on the device 3 that appear in the local database. After the update of the sound program content metadata, the new values may be applied at playback and result in loudness control that better matches the user's expectations.

Alternatively or in addition, the user may be presented with an immediate way of adjusting loudness normalization. For example, the user may use a mode of the audio playback device 3 that enables the user to adjust the normalized playback volume of pieces of sound program to their particular preferences. In this mode, the user's adjustments are recorded and applied to the piece of sound program content directly without any statistical analysis. This approach may be utilized by any audio playback application (e.g., the media player application 7). In one embodiment, a customized user interface may be provided in the media player application 7 that allows an associated user to monitor the loudness adjustment values, compare loudness levels of different pieces of sound program content, and manage custom loudness normalization features.

As described above and shown in FIG. 1-5, an enhanced loudness normalization scheme may utilize crowd-sourced feedback. This system may embed loudness adjustment metadata in the audio content to achieve a better user experience in terms of loudness control. In another embodiment, an offline version is also described that supports individual loudness normalization adjustments. Under either embodiment, loudness normalization may be achieved based on real world volume settings for individual pieces of sound program content played using various playback configurations.

As explained above, an embodiment of the invention may be an article of manufacture in which a machine-readable medium (such as microelectronic memory) has stored thereon instructions which program one or more data processing components (generically referred to here as a "processor") to perform the operations described above. In other embodiments, some of these operations might be performed by specific hardware components that contain hardwired logic (e.g., dedicated digital filter blocks and state machines). Those operations might alternatively be performed by any combination of programmed data processing components and fixed hardwired circuit components.

While certain embodiments have been described and shown in the accompanying drawings, it is to be understood that such embodiments are merely illustrative of and not restrictive on the broad invention, and that the invention is not limited to the specific constructions and arrangements shown and described, since various other modifications may occur to those of ordinary skill in the art. The description is thus to be regarded as illustrative instead of limiting.

What is claimed is:

1. A method for adjusting audio loudness, comprising:
   receiving, from each of one or more audio playback devices, data describing a piece of sound program content played by each of the one or more audio playback devices and user adjusted volume settings used by each of the one or more audio playback devices to play the piece of sound program content;
   determining a loudness adjustment level for the piece of sound program content based on the received user adjusted volume settings; wherein
      determining the loudness adjustment level for the piece of sound program content includes performing a statistical analysis on the received user adjusted volume settings; wherein
      the statistical analysis is performed relative to configurations of the one or more audio playback devices from which the user adjusted volume settings were received; wherein
      the configurations of the one or more audio playback devices describe one or more of 1) a type of the one or more audio playback devices used to play the piece of sound program content, 2) a type of speakers used by the one or more audio playback devices, and 3) a mode of the one or more audio playback devices used while playing the piece of sound program content; and
   transmitting the loudness adjustment level for the piece of sound program content to an audio playback device.

2. The method of claim 1, wherein transmitting the loudness adjustment level for the piece of sound program content to the audio playback device comprises:
   inserting the loudness adjustment level into metadata of the piece of sound program content prior to transmitting the piece of sound program content to the audio playback device.

3. The method of claim 2, wherein transmitting the loudness adjustment level for the piece of sound program content to the audio playback device comprises:
   transmitting the piece of sound program content, with the loudness adjustment level, to the audio playback device.

4. The method of claim 1, wherein transmitting the loudness adjustment level for the piece of sound program content to the audio playback device comprises:
   transmitting the loudness adjustment level to the audio playback device separate from the piece of sound program content.

5. The method of claim 1, further comprising:
playing, by the audio playback device, the piece of sound program content using the loudness adjustment level to normalize the loudness of sound generated by the audio playback device.

6. The method of claim 1, wherein the audio playback device is part of the one or more audio playback devices.

7. The method of claim 1, wherein the audio playback device is separate from the one or more audio playback devices.

8. A method for adjusting audio loudness, comprising:
receiving, from each of one or more audio playback devices, data describing a piece of sound program content played by each of the one or more audio playback devices and user adjusted volume settings used by each of the one or more audio playback devices to play the piece of sound program content;
determining a loudness adjustment level for the piece of sound program content based on the received user adjusted volume settings;
comparing an audio file stored on the audio playback device with a copy of a piece of sound program content stored on a remote server, wherein determining the loudness adjustment level for the piece of sound program content based on the received user adjusted volume settings is performed in response to determining a match between the copy of the piece of sound program content stored on the remote server and the audio file stored on the audio playback device; and
transmitting the loudness adjustment level for the piece of sound program content to an audio playback device.

9. A method for adjusting audio loudness, comprising:
collecting, by an audio playback device, data describing a piece of sound program content played by the audio playback device and user adjusted volume settings used by the audio playback device to play the piece of sound program content;
determining a loudness adjustment level for the piece of sound program content based on the received user adjusted volume settings; wherein
determining the loudness adjustment level for the piece of sound program content includes performing a statistical analysis on the collected user adjusted volume settings; wherein
the statistical analysis is performed relative to configurations of the audio playback device while the piece of sound program content was played before application of the loudness adjustment level; wherein
the configurations of the audio playback device describe one or more of 1) a type of the audio playback device, 2) a type of speakers used by the audio playback device, and 3) a mode of the audio playback device used while playing the piece of sound program content; and playing the piece of sound program content using the loudness adjustment level to normalize the loudness of sound generated by the audio playback device.

10. The method of claim 9, further comprising:
inserting the loudness adjustment level into metadata of the piece of sound program content.

11. An article of manufacture for adjusting audio loudness, comprising:
a non-transitory machine-readable storage medium that stores instructions which, when executed by a processor in a computer,
determine a loudness adjustment level for a piece of sound program content based on user adjusted volume settings used by each of one or more audio playback devices to play the piece of sound program content; wherein
determining the loudness adjustment level for the piece of sound program content includes performing a statistical analysis on the received user adjusted volume settings; wherein
the statistical analysis is performed relative to configurations of the one or more audio playback devices from which the user adjusted volume settings were received; wherein
the configurations of the one or audio playback devices describe one or more of 1) a type of the one or more audio playback devices used to play the piece of sound program content, 2) a type of speakers used by the one or more audio playback devices, and 3) a mode of the one or more audio playback devices while playing the piece of sound program content; and
insert the loudness adjustment level into metadata of the piece of sound program content prior to transmitting the piece of sound program content to an audio playback device.

12. The article of manufacture of claim 11, wherein the non-transitory machine-readable storage medium includes further instructions which, when executed by the processor:
compare an audio file stored on the audio playback device with a copy of the piece of sound program content stored on a remote server, wherein determining the loudness adjustment level for the piece of sound program content based on the received user adjusted volume settings is performed in response to determining a match between the copy of the piece of sound program content stored on the remote server and the audio file stored on the audio playback device.

13. The article of manufacture of claim 11, wherein the non-transitory machine-readable storage medium includes further instructions which, when executed by the processor:
transmit the piece of sound program content, with the loudness adjustment level, to the audio playback device.

* * * * *